(12) United States Patent
Nishihashi et al.

(10) Patent No.: US 8,791,433 B2
(45) Date of Patent: Jul. 29, 2014

(54) ION IMPLANTING APPARATUS

(75) Inventors: Tsutomu Nishihashi, Susono (JP);
Kazuhiro Watanabe, Susono (JP);
Tadashi Morita, Tsukuba (JP); Kenji Sato, Kawasaki (JP); Tsutomu Tanaka, Kawasaki (JP); Takuya Uzumaki, Kawasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 13/096,280

(22) Filed: Apr. 28, 2011

(65) Prior Publication Data
US 2011/0248182 A1 Oct. 13, 2011

Related U.S. Application Data

(63) Continuation of application No. PCT/JP2009/068367, filed on Oct. 27, 2009.

(30) Foreign Application Priority Data

Oct. 31, 2008 (JP) ................................ 2008-282365

(51) Int. Cl.
*G21G 1/00* (2006.01)
(52) U.S. Cl.
USPC .................. 250/492.3; 250/492.1; 250/492.2
(58) Field of Classification Search
USPC .................. 250/492.1, 492.2, 492.21, 492.3
See application file for complete search history.

(56) References Cited

U.S. PATENT DOCUMENTS

| | | | |
|---|---|---|---|
| 2006/0243920 A1* | 11/2006 | Ray et al. | 250/492.21 |
| 2007/0114440 A1* | 5/2007 | Yang | 250/440.11 |
| 2008/0179547 A1* | 7/2008 | Henley | 250/492.21 |

FOREIGN PATENT DOCUMENTS

| | | |
|---|---|---|
| JP | 3-295144 | 12/1991 |
| JP | 11-354066 | 12/1999 |
| JP | 2002-8578 A1 | 1/2002 |
| JP | 2002-288813 A1 | 10/2002 |
| JP | 2008-77756 A1 | 4/2008 |
| WO | WO 2008/035520 A1 | 3/2008 |

OTHER PUBLICATIONS

International Search Report for International Application No. PCT/JP2009/068367 dated Dec. 18, 2009.

* cited by examiner

*Primary Examiner* — Nicole Ippolito
*Assistant Examiner* — Hanway Chang
(74) *Attorney, Agent, or Firm* — Kratz, Quintos & Hanson, LLP

(57) ABSTRACT

An ion implanting apparatus is provided, which can accurately measure a quantity of atoms that are implanted. The ion implanting apparatus according to the present invention has an object to be measured, and the object to be measured is arranged in an irradiating range in which ions are irradiated. When atoms are implanted into an object to be processed by irradiating ions of a processing gas and neutralized particles thereof, the object to be measured is heated through the irradiation with the processing gas ions and the neutralized particles. A control unit determines a quantity of the atoms that are implanted into the object to be processed from the temperature of the object to be measured.

3 Claims, 2 Drawing Sheets

ION IMPLANTING APPARATUS

This application is a continuation of International Application No. PCT/JP2009/68367, filed on Oct. 27, 2009, which claims priority to Japan Patent Application No. 2008-282365, filed on Oct. 31, 2008. The contents of the prior applications are herein incorporated by reference in their entireties.

BACKGROUND OF THE INVENTION

1. Field of the Invention

The present invention generally relates to the ion implanting apparatus.

2. Description of the Background Art

In the field of magnetic storage media for hard discs, DTR (Discrete Track Recording media) and BPM (Bit Patterned Media) are known. The BPM in which a plurality of magnetic films are dispersed in the form of pits is expected to be a next-generation high density recording media.

The magnetic films of such magnetic storage media have conventionally been formed by patterning. In reproducing the record of the magnetic storage media, since the magnetic head floats above the surface of the magnetic storage media, smoothness of surface is desired. For this reason, a smoothing step to fill gaps among the magnetic films with a nonmagnetic material is necessary after the patterning.

In order to simplify the process by omitting the smoothening step, there is a publicly known method in which ions (ion beams) of a processing gas accelerated by an accelerator are irradiated upon an object to be processed in which a resist layer is disposed on the magnetic films (see, the below-mentioned Patent Documents 1 and 2).

The portions of the magnetic films which are covered with the resist layer are protected and not demagnetized, whereas in the processed portions on which no resist layer is disposed or on which there are thin covers of the resist layers, target atoms being constituent atoms of the processing gas are implanted into the magnetic films to demagnetize them. Therefore, the demagnetized portions are formed in the magnetic films along an opening pattern of the resist layer. The portions that remain magnetized (magnetic portions) are separated by the demagnetized portions; and the separated magnetic portions become storage areas in which storing/read-out of the information are made.

See, Japanese Patent Documents JP-A 2002-288813 and JP-A 2008-77756.

SUMMARY OF THE INVENTION

When excessive ions are implanted, the temperature of the object to be irradiated rises, which causes deterioration of the magnetic characteristics, so that the storage areas which should retain the magnetic property are demagnetized. Therefore, the demagnetizing process is carried out, while the ion-implanted quantity of the implantation of ions is being measured; and the demagnetizing process is terminated when the implanted quantity reaches a predetermined quantity.

Conventionally, an implanted quantity of ions was measured by using a Faraday cup. The Faraday cup is an electro-conductive vessel which is electrically insulated, and arranged with an opening of the vessel being directed to an ion irradiating device.

Since the ions are positively or negatively electrical-charged particles, current flows in the Faraday cup when the ions enter the Faraday cup. When the current flowing through the Faraday cup is measured and the relation between the measured value and the ion implanted quantity is determined, the ion implanted quantity can be calculated from the current value in an ammeter.

However, since the ion implanted quantity calculated from the current value in the Faraday cup is smaller than the ion implanted quantity actually implanted into the object to be processed, which causes excessive implantation (overdose) by implanting in accordance with the implanted quantity based on the current value of the Faraday cup.

Measures To Solve The Problems

Ions are irradiated in a vacuum atmosphere; and when ions of a processing gas having a material to be implanted are irradiated onto the object to be processed from the ion irradiating unit, an emission gas is released from the object to be processed, and the surrounding pressure of the Faraday cup becomes higher.

When the pressure becomes higher, the ions of the processing gas collide with the emission gas and other ions, and are partially neutralized. Since the ions of the processing gas are accelerated by an accelerator before becoming neutralized, the neutralized particles, which are the neutralized ions of the processing gas, are irradiated upon the object to be processed in a state of having a certain amount of acceleration energy, so that constituent atoms of the processing gas are implanted.

Therefore, not only the constituent atoms of the ions of the processing gas but also the constituent atoms of the neutralized particles are implanted into the object to be processed. However, it is to be understood that even when the neutralized particles enter the Faraday cup, no current flows in the Faraday cup, so that the ion implanted quantity calculated from the value of the current of the Faraday cup is smaller than the implanted quantity of the ions that has actually been implanted into the object to be processed, which causes excessive implantation (overdose).

In order to solve the above problems, an embodiment of the present invention is directed to an ion implanting apparatus, having a vacuum chamber, an ion irradiating unit for irradiating ions into the vacuum chamber, a substrate holder for holding an object to be processed in an irradiation range inside the vacuum chamber in which the ions are irradiated, an object to be measured, which is arranged in the irradiating range inside the vacuum chamber, and a temperature measuring unit for measuring the temperature of the object to be measured.

The present embodiment is also directed to the ion implanting apparatus, further having a control unit connected to the temperature measuring unit, and wherein a relation between the temperature of the object to be measured and the number of atoms to be implanted into the object to be processed is stored in the control unit.

The present invention is constructed as discussed above, and the object to be processed to be used in the present invention is, for example, platy, with both surfaces being processing faces into which the atoms are to be implanted.

Because contamination is caused by another member, such as the substrate holder, a sensor or the like, contacting the processing faces, only a very limited portion of such an object to be processed, such as side faces, can contact the other member, so that it is difficult to attach the sensor thereto.

The object to be measured is arranged such that it does not contact the object to be processed, so that the processing face of the object to be processed is not contaminated. Since the object to be measured and the object to be processed are both arranged in the ion irradiation range, when the ions are irradiated onto the object to be processed, the ions and neutralized particles are made incident to both of the object to be processed and the object to be measured to raise the temperatures thereof.

Accordingly, when the relationship between the temperature of the object to be measured and the number of the atoms implanted into the object to be processed is preliminarily determined, the implanted quantity of the constituent atoms of the ions into the object to be processed can be determined by measuring the temperature of the object to be measured.

Effects of the Invention

The implanted quantity of the ions into the object to be processed can be accurately determined. Since the demagnetization can be accurately controlled, highly reliable magnetic storage media can be obtained by separating magnetic films with precision. Since a sensor or the like does not need to be attached to the object to be processed, the object to be processed is not contaminated.

DETAILED DESCRIPTION OF THE PREFERRED EMBODIMENTS

Best Mode for Carrying Out the Invention

Figure 1:
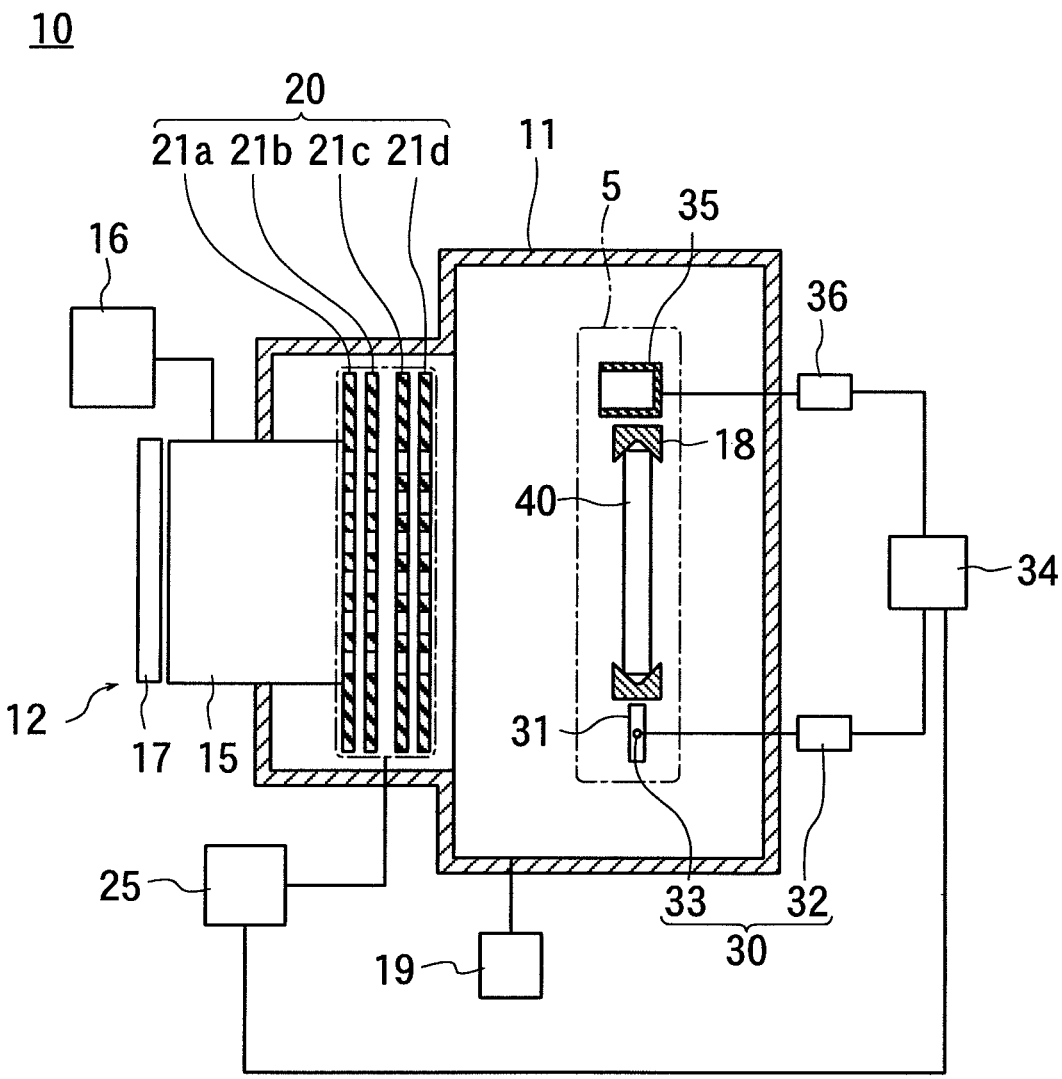
FIG. 1 is a sectional view for illustrating the ion implanting apparatus according to the present invention.

In FIG. 1, reference numeral 10 denotes one embodiment of the ion implanting apparatus according to the present invention.

The ion implanting apparatus 10 has a vacuum chamber 11 and an ion irradiating unit 12.

The ion irradiating unit 12 has an ion generator 15; and an internal space of the ion generator 15 is connected to an internal space of the vacuum chamber 11 via an emission opening which is not shown in the drawings. A vacuum evacuation system 19 is connected to the vacuum chamber 11. When the interior of the vacuum chamber 11 is evacuated to vacuum by the vacuum evacuation system 19, the interior of the ion generator 15 is also evacuated to vacuum.

A gas feed system 16 is connected to the ion generator 15; and the gas feed system 16 feeds a processing gas (such as, an $N_2$ gas) into the ion generator 15.

A high frequency antenna 17 is installed outside the ion generator 15; and when current is flown therethrough, the processing gas is ionized inside the ion generator 15, and emitted into the vacuum chamber 11 through the emission opening.

An accelerator 20 is arranged at a place opposed to the emission opening in the vacuum chamber 11. The accelerator 20 has one or a plurality of accelerating electrodes 21a to 21d, and the accelerating electrodes 21a to 21d are arranged along a direction in which the processing gas ions are emitted.

The accelerating electrodes 21a to 21d have through holes respectively formed therein, and the ions of the processing gas travel inside the accelerator 20 (namely, the through holes of the accelerating electrodes 21a to 21d and spaces between the accelerating electrodes 21a to 21d). In other words, the ions of the processing gas travel inside the accelerator 20, and then they are emitted inside the vacuum chamber 11.

The accelerating electrodes 21a to 21d are connected to an acceleration power source 25. The acceleration power source applies a voltage, which is generated by a potential difference, as an acceleration voltage between the accelerating electrodes 21a to 21d, to form an accelerating electric field inside the accelerator 20.

Since the ions of the processing gas are charged with electricity, the formation of the accelerating electric field extracts the ions from the ion generator 15, and the ions are accelerated during a period when they travel inside the accelerator 20, then the accelerated ions of the processing gas are irradiated into a predetermined range inside the vacuum chamber 11.

In FIG. 1, a reference numeral 5 denotes an irradiating range in which the accelerated ions of the processing gas are irradiated. An object to be processed 40 is carried inside the vacuum chamber 11 with the vacuum atmosphere being maintained, to come to rest in the irradiating range 5 or pass through the irradiating range 5, in a state of being held by the substrate holder 18.

Figure 2A:
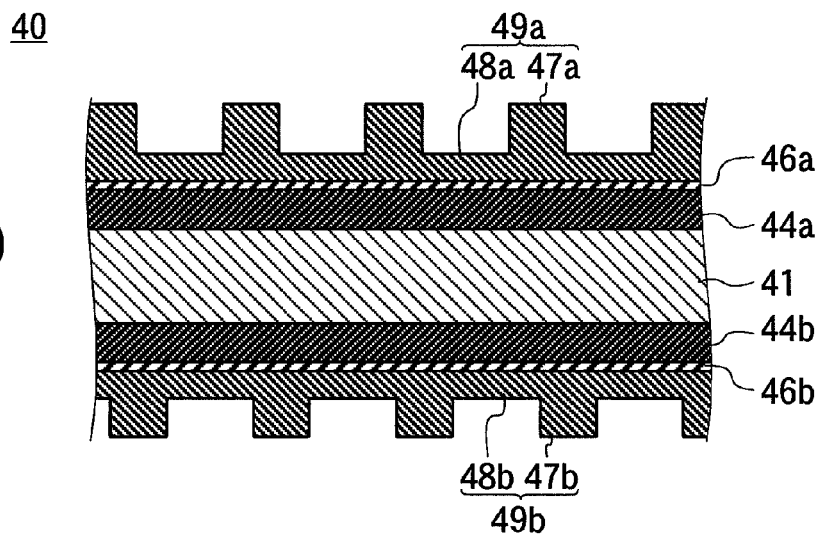
FIGS. 2(a) to (c) are sectional views for illustrating a manufacturing process of the magnetic storage media.

As shown in FIG. 2(a), the object to be processed 40 has a substrate 41, and magnetic films 44a, 44b arranged on a front face and a rear face of the substrate 41, and the entire shape is platy. Underlying films may be provided between the substrate 41 and the magnetic films 44a, 44b.

Both faces of this object to be processed 40 are processing faces; and resists 49a, 49b are arranged on the respective magnetic films 44a, 44b directly or via other films (such as, protective films 46a, 46b or the like).

Side faces of the object to be processed 40 contact a substrate holder 18, and the processing faces on which the resists 49a, 49b are arranged are exposed. In the irradiating range 5, at least one face of the object to be processed 40 faces toward the accelerator 20 of the ion irradiating unit 12.

In the irradiating range 5, an object to be measured 31 is arranged spaced apart from the substrate holder 18 and the object to be processed 40. The object to be measured 31 is, for example, a plate made of a heat-conductive material (such as, carbon or the like), and a front face faces toward the ion irradiating unit 12.

The object to be processed 40 or the object to be measured 31 is not located in positions such that one interrupts ions to enter the other, and the ions of the processing gas irradiated from the ion irradiating unit 12 enter the object to be processed 40 and the object to be measured 31.

The pressure of the irradiating range 5 becomes higher than in the other region inside the vacuum chamber 11 due to the gas emitted from the object to be processed by carrying out the irradiation of the ions of the processing gas, which causes the ions of the processing gas colliding with the emitted gas and the ions of the processing gas colliding with the non-ionized processing gas, so that part of the processing gas ions is neutralized.

Therefore, the processing gas ions and the neutralized particles generated by neutralizing the processing gas ions enter the object to be processed 40 and the object to be measured 31, and constituent atoms of the processing gas ions and the constituent atoms of the neutralized particles are implanted.

When the constituent atoms are implanted into the object to be measured 31, its temperature is raised. A temperature measuring unit 30 is connected to the object to be measured 31.

The temperature measuring unit 30 has a sensor 33 and a temperature detecting unit 32. The sensor 33 is buried in the object to be measured 31, and contacts the object to be measured 31.

The sensor 33 is connected to the temperature detecting unit 32; and the sensor 33 transmits the temperature of the object to be measured 31 to the temperature detecting unit 32 as an electric signal; and the temperature detecting unit 32 determines the temperature of the object to be measured 31 according to the electric signal. The temperature detecting unit 32 is connected to a control unit 34, and information on the temperature of the object to be measured 31 is transmitted to the control unit 34.

The greater the number of the atoms implanted into the object 40 to be processed, the greater the number of the atoms implanted into the object to be measured 31; therefore the temperature of the object to be measured 31 becomes high. In addition, when the acceleration voltage to be applied to the accelerator 20 is high and the accelerating energy rises, even when the number of the atoms implanted into the object to be measured 31 is the same, the temperature of the object to be measured 31 rises.

An electroconductive vessel (Faraday cup 35) is arranged in the irradiating range 5, and the Faraday cup 35 is connected to an ammeter 36. As to each accelerating voltage of the accelerator 20, the relationships among the temperature of the object to be measured 31, the current of the Faraday cup 35 and the number of the implanted atoms implanted into the object to be processed 40 are determined.

The relationships among the accelerating voltage to be actually used, the temperature and the number of the implanted atoms at the accelerating voltage are set in a control unit 34. The control unit 34 determines the number of the atoms implanted into the object to be processed 40 (for example, the number of the atoms per unit area) by checking the temperature measured by the temperature measuring unit 30 in comparison to the set relationship between the temperature and the number of the implanted atom.

The number of the atoms to be implanted into the object to be processed 40 is preliminarily determined. For example, as to the object to be processed 40 in FIG. 2(a), the number of the atoms to be implanted is a number of atoms such that among the magnetic films 44a, 44b, portions where thin-film portions 48a, 48b of the resists 49a, 49b are located are demagnetized, and the magnetism of portions where thick-film portions 47a, 47b are located remains.

A determined number of the atoms is set in the control unit 34, and when the number of the atoms determined from the temperature of the object to be measured 31 reaches the predetermined number of the atoms, the control unit 34 stops the acceleration power source 25 or closes a shutter which is not shown in the drawings to terminate the irradiation of the processing gas ions toward the object to be processed 40 and the object to be measured 31.

Figure 2B:
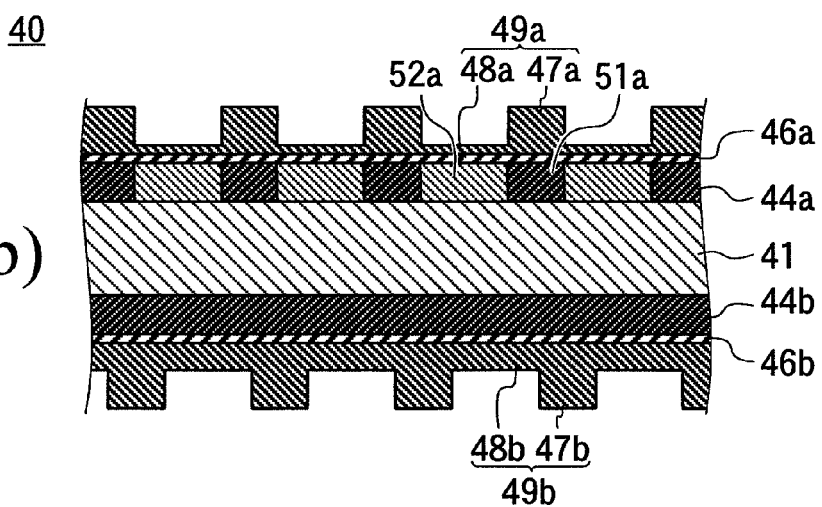

Since the number of the atoms implanted into the object to be processed 40 becomes the predetermined amount and to prevent excessive implantation, the portions where the thin-film portions 48a of the magnetic film 44a are arranged are demagnetized to be nonmagnetic portions 52a, whereas the portions where the thick-film portions 47a are arranged remain magnetic without being demagnetized to be separated in a plurality by the nonmagnetic portions 52a (FIG. 2(b) to become storage areas 51a.

Next, the face opposite the face on which the demagnetizing process of the object to be processed 40 is terminated is directed to the ion irradiating unit 12 by turning the object to be processed 40 about inside the same vacuum chamber 11 or by carrying the object to be processed 40 into another ion implanting apparatus having the same structure as in FIG. 1.

Figure 2C:
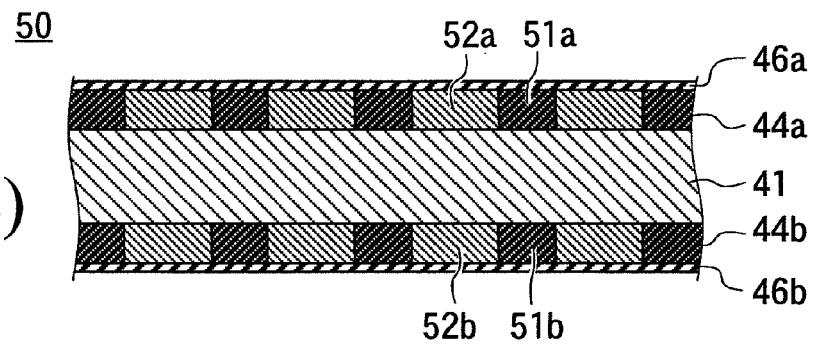

Similar to the previously performed demagnetization, the number of the atoms to be implanted into the object to be processed 40 is determined from the temperature of the object to be measured 31, and when it reaches the predetermined number of the atoms, the irradiation of the processing gas ions is stopped, so that as shown in FIG. 2(c), storage areas 51b and nonmagnetic portions 52b are formed in the portions where the thick-film portions 47b and the thin-film portions 48b are arranged.

In this regard, FIG. 2 (c) illustrates a magnetic storage medium 50 in which the resists 49a, 49b are peeled off after the demagnetization of both faces of the object to be processed 40 is terminated.

Since no excessive implantation occurs in performing the demagnetization processing, the storage areas 51a, 51b do not become narrowed, which allows reliability of the magnetic storage medium 50 to be high.

The above explanation is directed to the case where the atoms are implanted into the faces of the object to be processed 40 one by one, but the present invention is not limited thereto.

A plurality of the ion irradiating units 12 may be connected to the vacuum chamber 11 to irradiate the processing gas onto the both faces of the object to be processed 40 by irradiating processing gas ions in the same irradiating range. The processing gas ions may be irradiated onto the faces one by one or irradiated onto both faces at the same time.

In this case, the number of the atoms implanted into both faces of the object to be processed 40 may be determined from a measurement result of the temperature of the same object to be measured 31, or separate objects to be measured 31 may be provided for a front face and a rear face of the object to be processed 40, to determine the quantity of implanted ions into the front face of the object to be processed 40 from the object to be measured 31 for the front face, and to determine the quantity of implanted ions into the rear face of the object to be processed 40 may be determined from the front face of the processing object 31 to be measured for the rear face.

The type of processing gas is not particularly limited, and the constituent atom thereof is preferably, for example, at least one of the kinds selected from the group of O, N, B, P, F, H, C, Kr, Ar and Xe; more preferably one of the kinds selected from the group of O, N, B, P, Si, F, H and C, or one of the kinds selected from the group of Si, In, Ge, Bi, Kr, Xe and W; and further preferably, Si or Kr. In addition, two or more kinds of these atoms may be implanted. The kind of the processing gas for demagnetization may be changed between the front face and the rear face of the object to be processed 40.

Although the magnetic film 44 is not particularly limited, magnetic materials (such as, Fe, Co, Ni or the like) maybe used. More specifically, artificial lattice films (such as, Co/Pd, Co/Pt, Fe/Pd, Fe/Pt or the like, or a CoCrPt alloy or the like) may be used.

The protective film 46 is not particularly limited, either; for example, it may be formed by at least one of the protecting materials selected from the group consisting of carbons (such as, DLC (diamond-like carbon) or the like), hydrogenated carbon, carbon nitride, silicon carbide (SiC), $SiO_2$, $Zr_2O_3$ and TiN.

The resist 49a, 49b is, not particularly limited, but an example is an organic material (such as, a resin or the like), from which the thick-film portions 47a, 47b and the thin-film portions 48a, 48b in predetermined shapes are formed by means of a die (such as, a stamper), or by a photolithography method.

The substrate 41 is not particularly limited, so long as it is a nonmagnetic substrate; for example, a glass substrate, a resin substrate, a ceramic substrate, an aluminum substrate or the like, is used.

The ion implanting apparatus 10 according to the present invention may be widely applied to a method of producing the magnetic storage media in which a part of the magnetic film is demagnetized and a plurality of magnetic portions are separated; more specifically, the ion implanting apparatus can be used for producing various magnetic storage media (such as, DTR (Discrete Track Recording Media), BPM (Bit Patterned Media) or the like).

However, uses of the ion implanting apparatus 10 according to the present invention are not limited to the production of the magnetic storage media 50. It can be used for various ion processings (such as, ashing, ion implantation, etching or the like). Particularly, the ion implantation apparatus is suitable for objects in which both faces are to be processed with ions, and only a narrow range (such as, a side face or the like), can contact another member (such as, a substrate holder 18 or the like).

Although, the shape or the material of the object to be measured 31 is not particularly limited, such that when it is made of a heat-conductive material (such as, carbon or the like), the entire object to be measured 31 is heated, which enables the temperature of the object to be measured 31 to be accurately measured even if a sensor is provided in a position where the processing gas ions are not directly irradiated. When the sensor is not directly irradiated with the processing gas ions, the lifetime of the sensor is prolonged.

The processing gas ions may be irradiated to the object to be measured 31 and the object to be processed 40 at the same time, or the processing gas ions may be irradiated alternately or in a sequential order onto the object 31 to be measured and the object to be processed 40 by moving the irradiating position with a beam of the processing gas ions.

The object to be measured 31 is brought to the processing object 40 such that the ratio between the processing gas ions and the neutralized particles entering the object to be measured 31 may be equal to the ratio between the processing gas ions and the neutralized particles entering the object to be processed 40, a measuring error becoming smaller between the number of the atoms implanted into the object to be processed 40 detected based on the temperature of the object to be measured 31 and the number of the atoms actually implanted.

What is claimed is:

1. An ion implanting apparatus, comprising
a vacuum chamber;
an ion irradiating unit for irradiating ions into the vacuum chamber;
a substrate holder for holding an object to be processed in an irradiating range of ions inside the vacuum chamber in which the ions are irradiated;
an object to be measured, which is arranged in the irradiating range of ions inside the vacuum chamber;
a temperature measuring unit for measuring the temperature of the object to be measured when the ions are irradiated on the object to be measured and on the object to be processed together; and
a control unit which is connected to the temperature measuring unit,
wherein the object to be measured and the object to be processed are both arranged in the ion irradiation range, when the ions are irradiated onto the object to be processed, the ions and neutralized particles are made incident to both of the object to be processed and the object to be measured, to raise temperatures,
wherein a relationship between a temperature of the object to be measured and a number of atoms to be implanted into the object to be processed is stored in the control unit, When the ions are irradiated,
wherein the number of atoms implanted into the object to be processed is being determined from the temperature measured by the temperature measuring unit, and when the determined number of atoms reaches the predetermined number of the atoms, irradiation of the ions on the object to be processed and the object to be measured is being terminated.

2. The ion implanting apparatus as set forth in claim 1, wherein the object to be measured is arranged spaced apart from the object to be processed.

3. The ion implanting apparatus as set forth in claim 2, wherein the temperature measuring unit includes a sensor contacted with the object to be measured, and the temperature of the object to be measured is being detected by the sensor.

* * * * *